(12) United States Patent
Schertler et al.

(10) Patent No.: US 6,454,908 B1
(45) Date of Patent: Sep. 24, 2002

(54) VACUUM TREATMENT SYSTEM

(75) Inventors: Roman Schertler, Wolfurt (AT); Martin Dubs, Trübbach (CH)

(73) Assignee: Unaxis Trading AG, Trübbach (CH)

( * ) Notice: Subject to any disclaimer, the term of this patent is extended or adjusted under 35 U.S.C. 154(b) by 0 days.

(21) Appl. No.: 09/602,522

(22) Filed: Jun. 22, 2000

Related U.S. Application Data

(63) Continuation of application No. PCT/CH98/00513, filed on Dec. 3, 1998.

(30) Foreign Application Priority Data

Dec. 22, 1997 (CH) .............................................. 2940/97
May 13, 1998 (CH) .............................................. 1065/98

(51) Int. Cl.$^7$ .............................................. C23C 14/34
(52) U.S. Cl. .......................... 204/192.12; 204/298.15; 204/298.23; 204/298.28; 204/298.27; 204/298.25; 118/730; 118/719; 198/377.01
(58) Field of Search ...................... 204/192.12, 298.15, 204/298.23, 298.27, 298.28, 298.25; 118/730, 719; 198/377.01

(56) References Cited

U.S. PATENT DOCUMENTS

| | | | | |
|---|---|---|---|---|
| 5,240,583 A | | 8/1993 | Ahonen | 204/298.04 |
| 5,468,299 A | * | 11/1995 | Tsai | 118/730 |
| 5,569,967 A | | 10/1996 | Rode | 310/103 |
| 5,795,448 A | * | 8/1998 | Hurwitt et al. | 204/192.1 |

FOREIGN PATENT DOCUMENTS

| | | | | |
|---|---|---|---|---|
| DE | 196 49 412 | | 6/1997 | |
| JP | 02223375 | | 1/1990 | |
| JP | 02102947 | | 4/1990 | |
| JP | 4-52275 | * | 2/1992 | 204/298.04 |

* cited by examiner

Primary Examiner—Rodney G. McDonald
(74) Attorney, Agent, or Firm—Crowell & Moring LLP

(57) ABSTRACT

A vacuum treatment system has a vacuum chamber in which there is at least one part which is driven in rotation and is connected by a gear train which comprises at least two rotating transmission bodies with a motor drive unit. The rotating transmission bodies produce a relative motion in a rolling manner. For this purpose, the bodies have axes of rotation that are not aligned. The rotating transmission bodies are magnetically drive-coupled to each other, and at least one of them is located in the vacuum chamber.

21 Claims, 6 Drawing Sheets

VACUUM TREATMENT SYSTEM

This is a continuation of PCT/CH98/00513 filed Dec. 3, 1998.

BACKGROUND OF THE INVENTION

This application claims priority of prior foreign applications 1997 2940/97 and 1998/1065/98, filed on Dec. 22, 1997 and May 13, 1998, respectively, the disclosure of which is expressly incorporated by reference here.

The present invention relates to a vacuum treatment system having a vacuum chamber, and at least one rotatably driven part lo within that chamber, which rotatably driven part is connected by way of a transmission comprising at least two mutually rolling-off rotational transmission bodies with a motor-type drive unit.

The present invention is addressed to problems which occur during vacuum coating, particularly of optical disks, particularly of rewrite disks. However, the findings made here can also easily be applied to other vacuum treatments; in principle, wherever a part must be rotatably driven in a vacuum treatment chamber of a system.

It is known to provide substrate carriers on planet wheels of a planetary transmission, for example, for sputtering systems, in order to implement, by way of a sputtering source, while utilizing maximal fractions of sputtered-off material on the substrates, a distribution of the applied layer thickness which is as homogeneous as possible. For the rotary drive, normally gear-type transmissions are used in the vacuum atmosphere.

It is disadvantageous to use such transmissions in the treatment vacuum of the system, particularly because of occurring abrasion and the resulting contamination risk to the built-up layers, but also with respect to the development of noise, friction-caused losses—because lubricants suitable for a vacuum have relatively poor lubricating properties—and, as a result, because of the short service life after which rotational transmission bodies having gears have to be replaced.

A system having a planetary transmission is described in DE 196 49 412. In that system, the addressed problems are solved in that the sun and planet system is constructed twice, specifically without gears on the interior side of the vacuum chamber and geared on the exterior side of the vacuum chamber. The sun system on the interior side of the vacuum chamber is driven by a shaft extending through the vacuum chamber wall, while the planets on the interior side of the vacuum chamber which have the substrate carriers are driven by magnetic couplings which are established through chamber wall sections with planets on the outside of the chamber.

This approach using magnetic couplings requires extremely high expenditures. Concerning magnetic rotation transmission devices on pumps, reference is made to U.S. Pat. No. 4,850,821 or 5,449,276.

SUMMARY OF THE INVENTION

An object of the present invention is to provide a vacuum treatment system which, although a transmission is provided in the vacuum, which in DE 196 49 412 is displaced to the outside, is capable of eliminating the above-indicated disadvantages. For this purpose, the system according to the invention is characterized by the at least two rotational transmission bodies being operatively coupled magnetically.

In the present case, a roll-off movement is a movement during which the above-mentioned rotational bodies can move as if they rolled off on one another, but for this purpose, because of the magnetic coupling, do not necessarily have to be in contact with one another.

In a first currently preferred embodiment, the motor-type drive for the above-mentioned transmission is arranged outside the vacuum chamber, and the driving of the transmission takes place by way of a shaft extending in a vacuum-tight manner through the vacuum chamber wall or by way of a magnetic coupling which acts through the wall of the vacuum chamber from the drive upon the transmission. In another currently preferred embodiment, while the drive is situated on the outside, the magnetic drive coupling of the mutually rolling-off rotational bodies takes place by way of the chamber wall. As a result, the drive coupling and the transmission through the chamber wall are implemented simultaneously.

On their periphery, the rotational transmission bodies—analogous to the gearing of such rotational bodies on geared transmissions—have permanent-magnet segments which, as a result of a mutual attraction or repulsion, in this case, preferably by mutual attraction, ensure the magnetic drive transmission.

In still another currently preferred embodiment, the transmission is constructed as a planetary transmission in which the sun wheel is operatively connected with the motor-type drive unit, and the planet wheels are magnetically coupled with respect to the drive.

By replacing the gears on geared transmissions by "magnet gears" which are arranged at uniform distances from one another on the participating rotational bodies and "engage in one another" preferably by mutual attraction, or by repulsion, depending on the usage, the transmission types can be implemented which are known from geared transmissions; for example, by providing "magnetically geared" spur gears, wheels with internal gears, bevel gears, worm gears, crown gears, etc. In principle, it is achieved according to the invention that the drive-transmitting rotational bodies of the transmission no longer result in abrasion, the resulting transmission has a much lower friction than analogous mechanical, geared transmissions, and thus require a significantly reduced driving power, in that lubrication problems and therefore also problems concerning a reduced service life are significantly reduced.

Using the principle according to the invention, it is also possible to suggest a sputtering process according to the invention which exhibit s a hardly surpassable process homogeneity on the workpieces.

BRIEF DESCRIPTION OF THE DRAWINGS

Other objects, advantages and novel features of the present invention will become apparent from the following detailed description of the invention when considered in conjunction with the accompanying drawings.

DETAILED DESCRIPTION OF THE DRAWINGS

Figure 1:
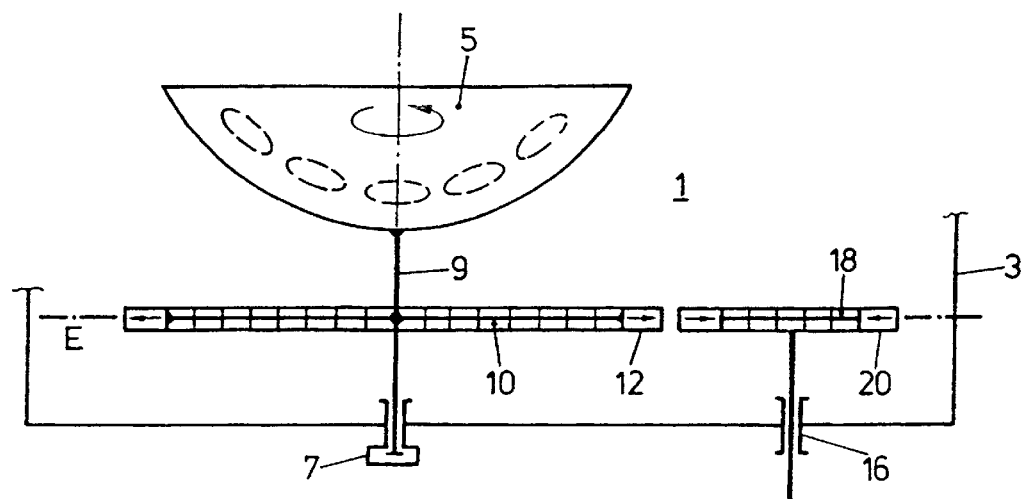
FIG. 1 is a schematic view of a first embodiment of a vacuum treatment system according to the invention using an example having a workpiece carrier calotte.

In a vacuum chamber 1, shown in FIG. 1, with a vacuum chamber wall 3, for example, a workpiece calotte 5, as the part to be rotated therein, is rotationally disposed, as schematically illustrated at reference number 7. A driving wheel 10 is operatively connected with the axis of rotation 9 of the calotte 5 and has a peripheral permanent-magnet collar 12. A driving motor 14 mounted outside the vacuum chamber 1 acts by way of a vacuum-tight rotational passage 16 upon a driving wheel 18 having a peripheral collar 20 of permanent magnets. The wheels 10, 18 are situated in a common plane E and do not touch one another. Because of the mutual attraction and/or repulsion effect of the mutually respectively adjacent permanent magnets of the collars 12, 20, the drive of the unit 14 is transmitted to the wheel 10 and thus to the calotte 5.

Wheel 10 and wheel 18 form the transmission according to the invention and roll off on one another in the above-mentioned sense.

Figure 2:
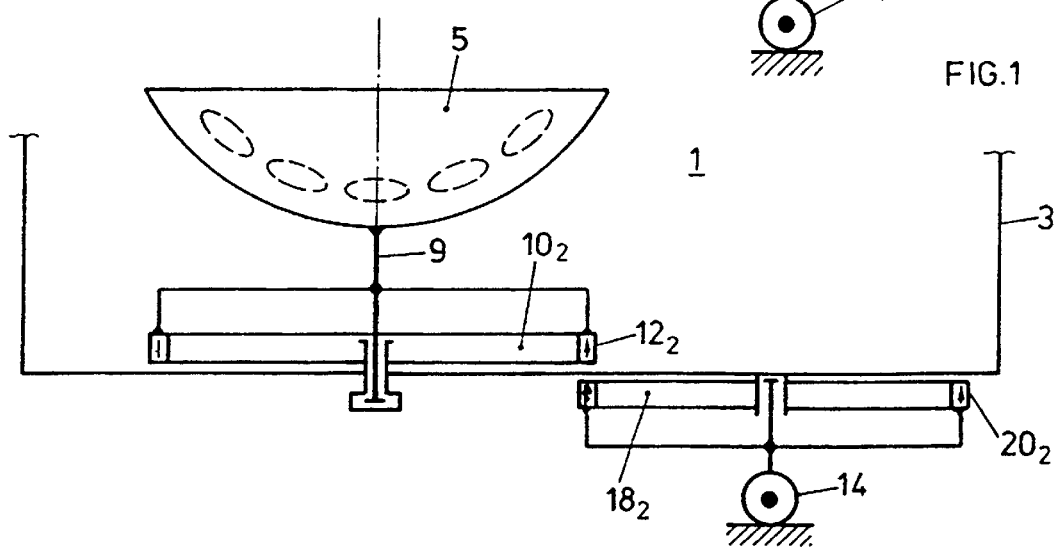
FIG. 2 is a schematic view of another embodiment of the system according to FIG. 1.

Analogously to the representation of FIG. 1, FIG. 2 illustrates a system according to the invention in which no vacuum-tight rotational passage has to be provided and the complications of the system known from DE 196 49 412 are nevertheless eliminated in that no magnetic coupling but a magnetic drive transmission takes place between mutually rolling-off gear wheels through the chamber wall.

On the driving shaft 9 of the calotte 5, a driving wheel $10_2$ is provided which has a permanent magnet collar 122 arranged along its periphery. While, in the embodiment according to FIG. 1, the magnetic dipoles are arranged in the plane E, thus radially with respect to the axis of rotation 9, in the embodiment according to FIG. 2, they are disposed parallel to the axis 9. Outside the wall 3 of the vacuum chamber 1, the motor drive 14 is again provided which acts upon a rotationally disposed driving wheel $18_2$ provided outside the chamber 1 and which, with respect to the arrangement of the peripheral magnet collar $20_2$, is constructed like the wheel $10_2$. As clearly indicated, the rolling drive transmission takes place from the wheel $18_2$ outside the chamber to wheel $10_2$ inside the chamber by way of the wall 3 which is optionally constructed there for an optimal magnetic penetration, which eliminates the necessity of a vacuum-tight rotational passage.

The foregoing illustrates that the magnetic drive penetration according to the invention from one rotational body to the other can take place completely in the vacuum or through a correspondingly constructed wall section of the vacuum chamber wall 3.

However, in contrast to the vacuum coupling, according to the invention, the two rotational bodies roll off relative to one a another.

Figure 3:
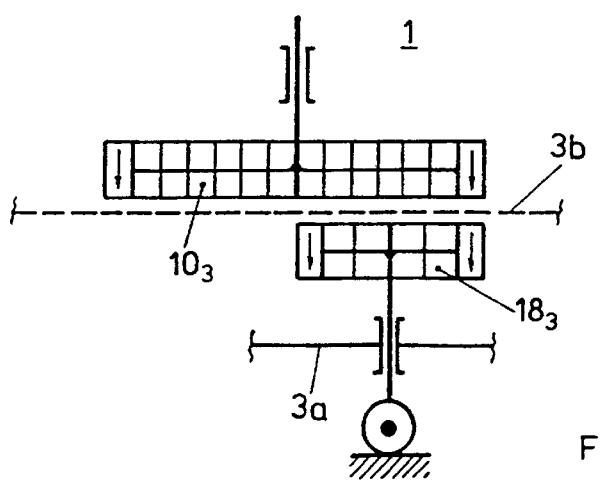
FIG. 3 is a cutout-type schematic view of another embodiment of a system according to the invention.

FIG. 3 illustrates another possibility according to the invention of magnetically coupling rotational bodies $10_3$ and $18_3$. Analogous to FIGS. 1 and 2, the vacuum chamber wall 3 can be provided as illustrated at reference number 3a or as illustrated by a broken line, with a magnetic penetration through the wall, at point $3_b$.

Figure 4:
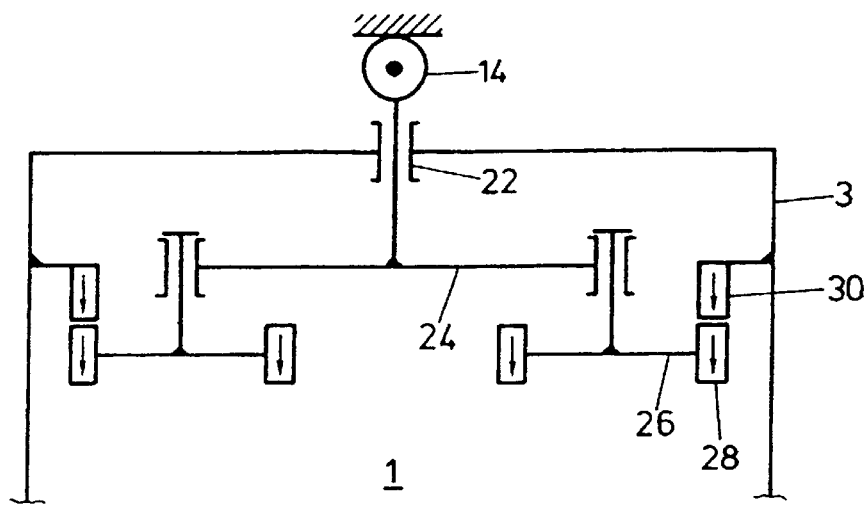
FIG. 4 is a schematic view of a system according to the invention having a planetary transmission.

FIG. 4 shows the implementation of the present invention on a planetary transmission. By way of a vacuum-tight rotational coupling 22, the drive 14 acts upon the sun wheel 24 in the vacuum chamber 1, on which the planetary wheels 26 are rotatably disposed which have the substrate carriers (not shown).

The planet wheels 26 are in an operative connection by way of peripheral permanent-magnet collars 28 inside the vacuum chamber 1 with a stationary magnet collar 30.

Figure 5:
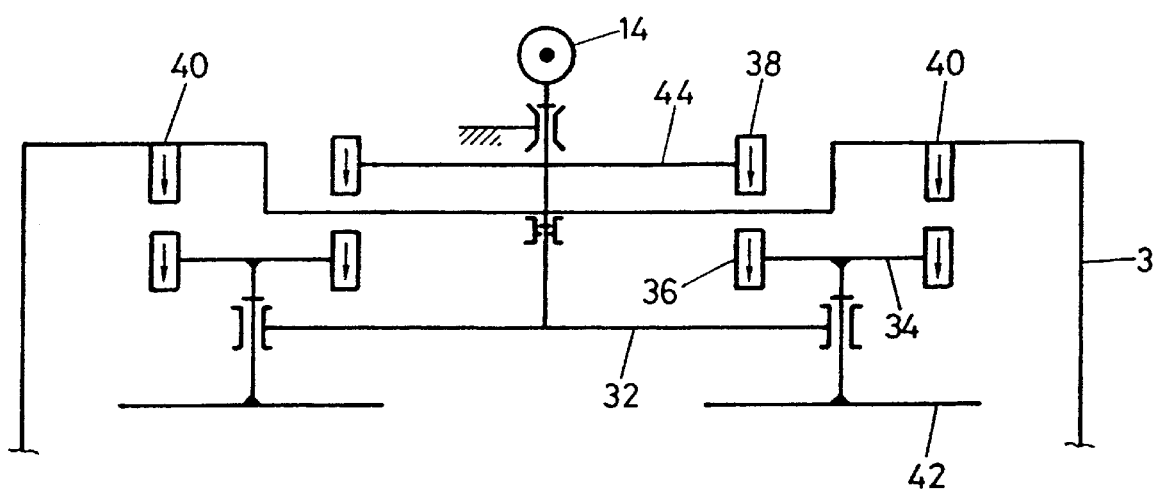
FIG. 5 is a schematic view of another embodiment of a system having a planetary transmission.

In an embodiment of the planet wheels according to FIG. 5, the drive 14 acts upon a driving wheel 44 which is on the outside with respect to the chamber wall 3. A supporting wheel 32 is rotationally disposed inside the vacuum chamber and carries the planet wheels 34 on its periphery. On the one hand, the peripheral magnet collar 36 of the planet wheels engages with a peripheral magnet collar 38 of the driving wheel 44 by way of the wall 3 of the vacuum chamber. On the other hand, the collar 36 engages with a stationary permanent-magnet collar 40. Reference number 42 indicates the substrate carriers on the planet wheels 34. Similarly to a gear wheel which is driven between an exterior stationary gear rim 40 and a central gear wheel 38, the planet wheels 34 with their magnet collars 36 rotate between the central magnetic driving wheel 44 and the peripheral stationary magnet collar 40.

In the embodiment according to FIG. 5, neither a vacuum-tight rotational passage is to be provided through the chamber wall, nor a double implementation of a planetary system, as, for example, according to DE 196 49 412. Of course, it is easily possible, for example, in the case of the system according to FIG. 4, to replace the drive transmission by way of a vacuum-tight rotational passage by a magnetic coupling in which the drive 14 acts without a passage upon the sun wheel 24 through the wall 3 of the vacuum chamber.

In addition, other embodiments can be implemented, in which, for example, as in FIG. 5, the radii of the magnet collars 44 and 40 are exchanged in order to permit a different rotational speed range for the sun wheels and the planet wheels.

However, for vacuum coatings, it is advantageous, as, for example, in FIG. 5, to rotate the planet wheels at a higher rotational speed than the sun wheel.

The embodiment, particularly according to FIG. 2, may be disadvantageous in that, because of the drive transmission, significant moments of tilt act upon the bearings. This results in problems, particularly when a miniaturization is desirable. A solution which is improved in this respect is again schematically shown in FIG. 6. This embodiment is easily understandable for a person skilled in the art according to the above-mentioned explanations with regard to the several embodiments which use the same reference numbers for similar parts.

Figure 6:
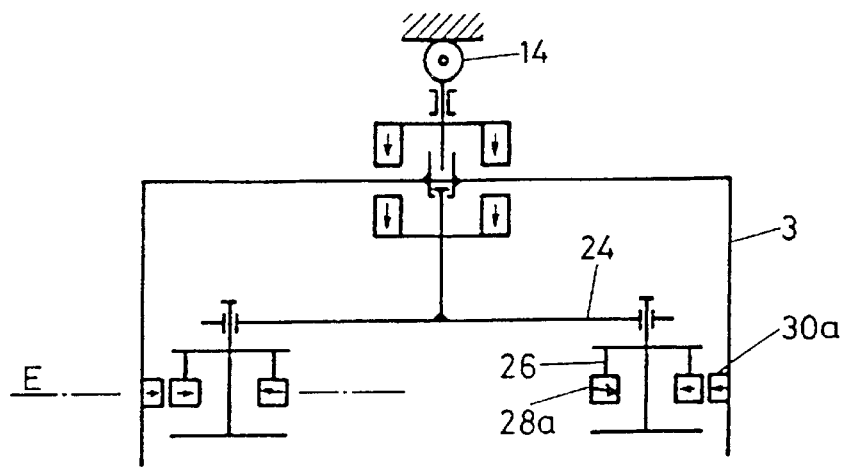
FIG. 6 is a schematic view analogous to FIGS. 1 to 5 of a preferred embodiment of a system according to the invention.

In contrast to the embodiment of FIG. 4, according to FIG. 6, the magnets 30a of the stationary magnet collar and the magnets 28a of the planets 26 are arranged acting in a plane E, which is situated perpendicular to the axes of rotation of the sun wheel 24 and of the planet wheels 26. Thus, to the largest extent and depending on the lengths of the axes, only radial forces act with respect to the bearings. Thereby occurring moments of tilt at the planetary bearings are minimized.

Thus, as explained in the following, based on the transmission according to FIG. 6, according to the invention, a vacuum treatment system is conceived for the vacuum treatment particularly of circularly shaped storage disks, particularly of magneto-optical storage disks, but also, for example, of CDs, minidisks, etc. As will be demonstrated, the system is basically conceived as a cluster system and comprises a central handling chamber or transport chamber with inlet/outlet gate chambers, treatment chambers, and optionally additional transport chambers flanged thereto which may be flexibly combined in order to meet the respective occurring requirements of the storage disk production.

Figure 7:
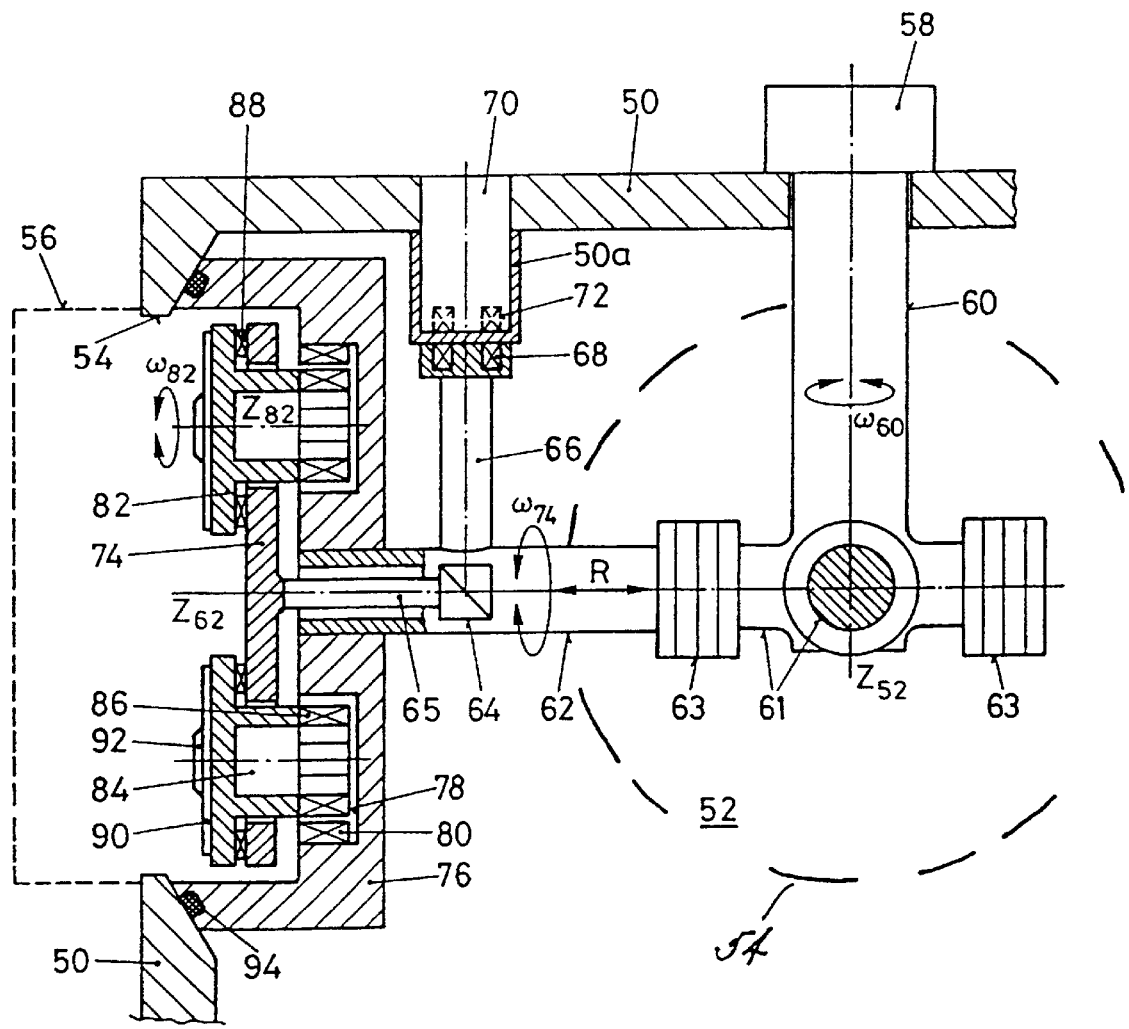
FIG. 7 is a simplified longitudinal sectional view of a cutout of a system according to the invention based on a drive transmission according to FIG. 6.

For reasons of clarity, FIG. 7 is a simplified, longitudinal sectional view of a portion of such a system. On the cylindrical wall 50, which is illustrated as a cutout, of a central transport chamber 52, openings 54 are provided, to which, as illustrated by broken lines at reference number 56, gate chambers, treatment stations or additional transport chambers are flanged as treatment stations, such as coating chambers, conditioning chambers, etching chambers, or the like. A transport arrangement 60 is rotationally driven in a controlled manner, $\omega_{60}$, by a rotational drive 58 about the axis $Z_{52}$ of the essentially cylindrical transport chamber 52. One or preferably several projecting transport arms 61 are provided on the transport arrangement 60. The parts 62 of the transport arms 61 can be moved out and returned with respect to the axis $Z_{52}$, as illustrated by the double arrow R, by an encapsulated, preferably bellows-encapsulated, drive 63. The drives 63 of the transport arms are preferably independent of one another.

One 90° deflecting transmission 64 respectively is installed on the arm parts or sections 62 which are radially displaceable with respect the axis $Z_{52}$. On the drive side, the transmission 64 is connected with a drive shaft 66 which projects upward parallel to the axis $Z_{52}$, which carries a magnetic coupling disk 68 on its end. Outside the chamber wall 50, a drive 70 is installed which has a second magnetic coupling disk 72, the latter acting by way of a correspondingly dimensioned wall part 50a onto the coupling disk 68.

On the output side, the deflecting transmission 64 acts by way of an output shaft 65 onto the sun wheel 74. A sealing plate 76 is fixedly connected with the arm section 62. Concentrically to the axis $Z_{62}$ of the arm 61, the sealing plate 76 has a ring groove 78. Corresponding to the magnets 30a of FIG. 6, the magnets 80 are arranged on the outer groove shoulder, thus forming the stationary magnet collar according to FIG. 6.

The sun wheel 74 carries, for example, four workpiece carrier plates 82 as planet wheels 26 according to FIG. 6. On the sun wheel side, bushes 84, which project coaxially to the planet wheel axes $Z_{82}$, are provided on the workpiece carrier plates 82, which o bushes 84 carry one magnet collar respectively, which has magnets 86, on their end, corresponding to the magnets 28a of FIG. 6. These magnets 86 are aimed at the magnets 80 of the stationary magnet collar on the sealing plate 76. The workpiece carrier plates 82 are rotationally disposed, for example, peripherally, as schematically illustrated by the bearings 88. On the workpiece carrier plates 82, circular-disk-shaped workpieces 90, as mentioned above, particularly storage disks, such as CDs, minidisks, but particularly MO disks, are deposited and are held preferably magnetically, for example, by a central mask 92.

The method of operation of the system, which is illustrated in a simplified and schematic manner, is the following: By the radial drive 63, the arm sections 62, preferably mutually independently, and, as a result, the other parts connected with section 62, are advanced and returned. If the workpieces 90 are to be treated in a treatment chamber 56, the arrangement coupled with section 62 is advanced according to FIG. 7 toward the left against the opening 54. As a result, the magnetic coupling 72/68 is established, and the sealing late 76 is placed by the seal 94 to the required extent tightly against the chamber wall 50 around the respective opening 54. In the process, the workpiece carrier plates 82 are pushed into the treatment position.

By way of the chamber wall 50a, the drive shaft 66, the deflecting transmission 64, the sun wheel 74 is now caused to rotate $\omega_{74}$, whereby, analogous to FIG. 6, the workpiece carrier plates 82 are, on the one hand, rotated—$\omega_{74}$—about the axis $Z_{62}$; and, on the other hand, are caused to rotate themselves—$\omega_{82}$—about their own axes $Z_{82}$.

In the case of all treatment stations 56 flanged to the central transport chamber 52, where the above-mentioned double rotational movement of the workpiece disks is desirable, a drive 70 is provided which, as soon as the transport arrangement 60 aims one of the arms 61 at one of the openings 54 and the section 62 has moved out, takes over the rotational drive of the planetary arrangement.

Figure 8:
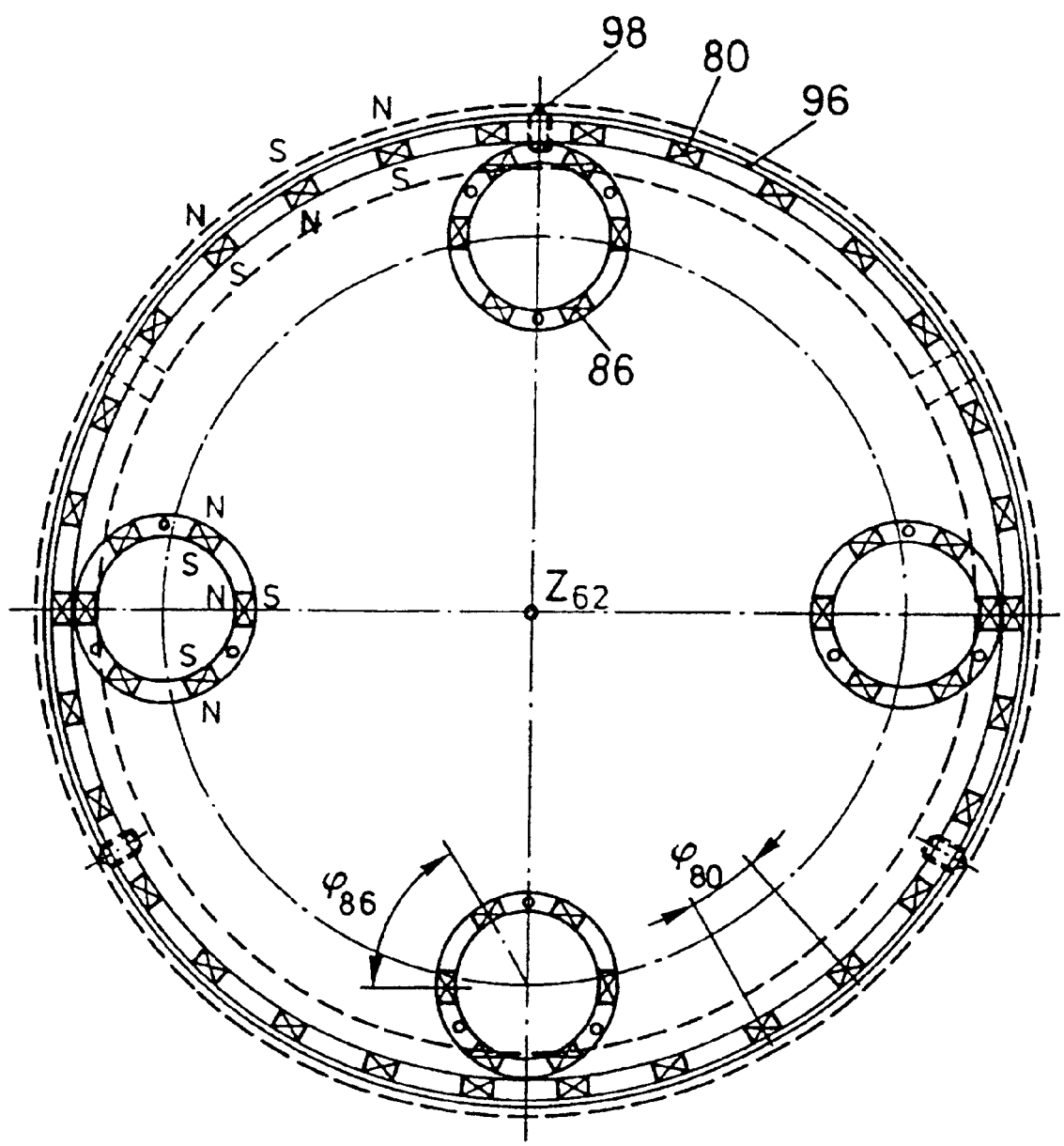
FIG. 8 is a top view of the arrangement of the magnetic drive transmission on the system according to FIG. 7.

In a ton view, FIG. 8 shows the arrangement of the stationary magnets 80 as well as of the planetary magnets 86 according to FIG. 7. Peripherally on the outside, preferably a sheet metal ring 96 is provided around the stationary magnet collar. The sheet metal ring 96 has a magnetically shielding and a magnetic-field-increasing effect on the drive coupling. On the stationary side as well as on the planet wheel side, rare-earth magnets, particularly neodymium magnets, are preferably used as the magnets. They are preferably polarized in a radial and alternating manner, S, N.

As indicated in FIG. 8, the radian measures $\psi_{86}$ and $\psi_{80}$ measured in the contact area are preferably identical; however, deviations of no more than 25% can possibly be tolerated. As a result, a jolt-free drive transmission is ensured. The number of magnets 80 and 86 provided on the stationary side and on the planet wheel side respectively is an even number; on the planet wheel side, at least two, preferably four and, particularly preferably six and more magnets are provided.

In order to ensure that a drive transmission takes place, a sensor 98 is provided preferably in the area of one of the magnet collars moving relative to one another, preferably on the stationary magnet collar, by way of which sensor 98, the drive transmission field is monitored which changes in the normal operation. A Hall sensor is preferably used for this purpose. A defined periodic signal is measured in the normal operation. In the event of the blockage of the sun wheel or of one of the planet wheels, this is detected by certain changes with respect to the normal-operation signal. This permits a detailed monitoring of the operation.

Figure 9:
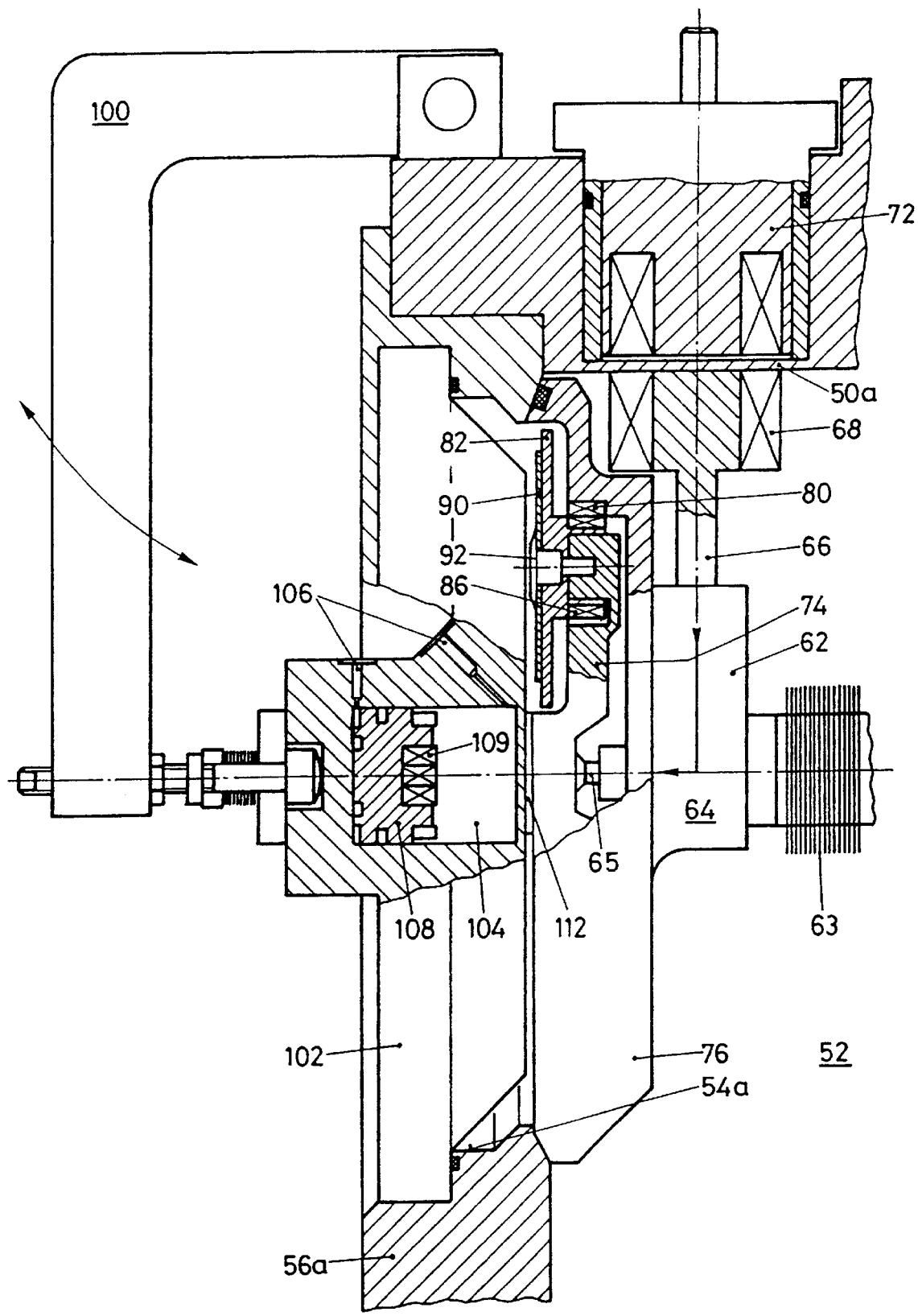
FIG. 9 is a more detailed view of the inlet/outlet gate provided on the system according to FIG. 7 as a longitudinal sectional view according to FIG. 7.

FIG. 9 is also a simplified but slightly more detailed longitudinal sectional view than FIG. 7 of a cutout of a system according to the invention which, analogous to the representation according to FIG. 7, comprises a flanged-on gate chamber.

After the explanations of the simplified representation of FIG. 7, only the special aspects of the gate chamber must still be explained by reference to FIG. 9.

By way of a rocker lever 100, the gate chamber lid 102 is lifted off and placed on the gate chamber 56a. Gate-lid-side transfer elements for the take-over and the transfer of the workpiece disks 90 rotated into the desired position by the drive 72 are not shown. In a variation, they can comprise magnet arrangements on the gate lid 102 in order to pull the workpieces with the masks 92 made in this case of a magnetic material from the plates 82 and place them on these plates.

Centrally on the gate lid 102, a piston/cylinder arrangement 104 is provided having a piston 108 which can be displaced in a controlled manner by way of pneumatic connections 106 and has permanent magnets 109. In a preferred embodiment, by way of a central disk 112 made of a magnetic material, the sun wheel/planet wheel system is exchanged as the carrier of the workpieces.

Figure 10:
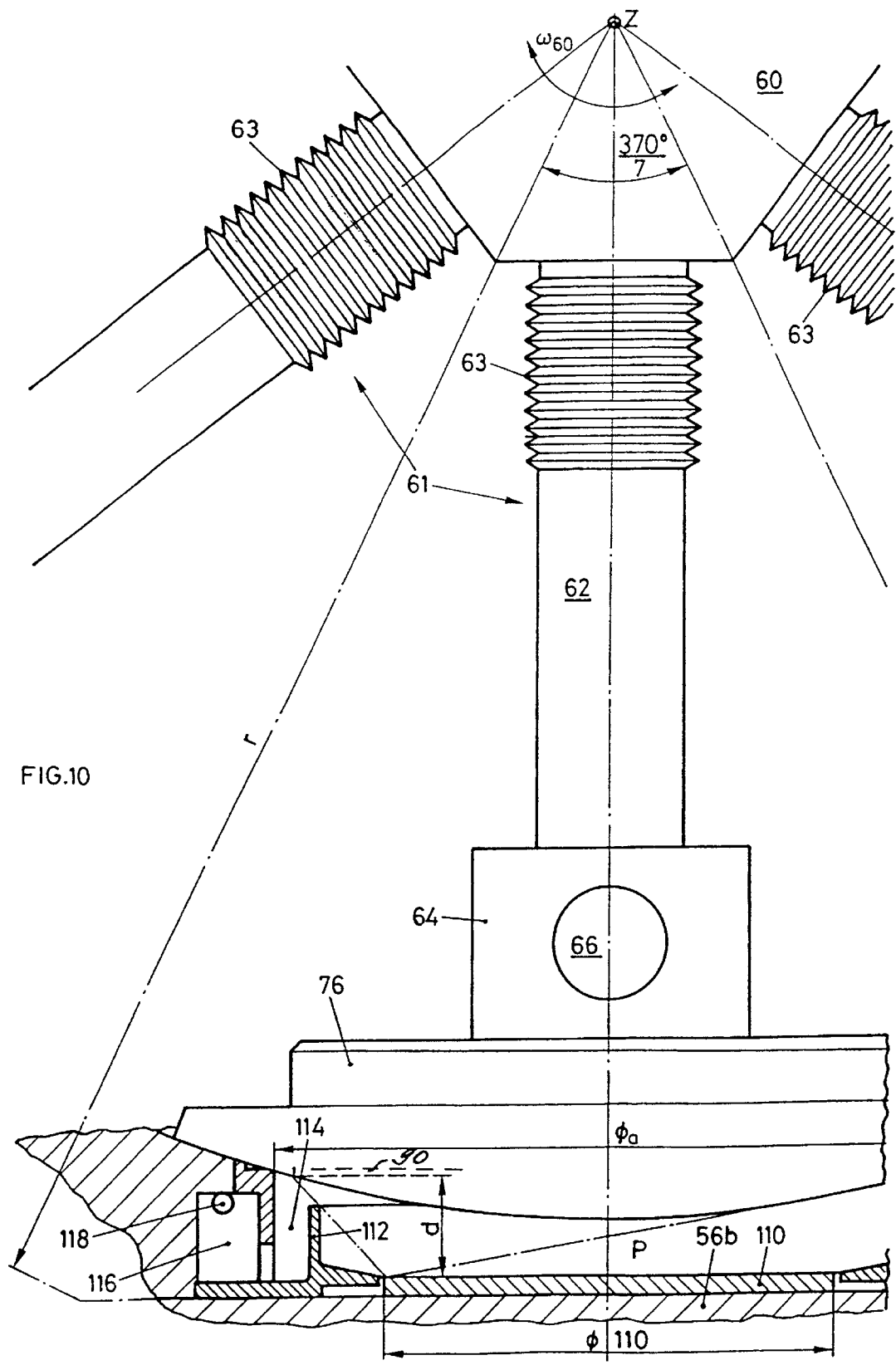
FIG. 10 is a simplified top view of the system according to FIGS. 7 to 9 showing a system cutout with a flanged-on sputtering station.

FIG. 10 is a partially—only stator-side—sectional representation of a cutout of the system according to the invention to which a sputtering station is flanged. The reference numbers used in FIG. 7 are used for units having the same effect.

FIG. 10 illustrates how the workpieces 90 are treated at a sputtering station 56b on the system according to the invention. The target 110 has a diameter $\psi_{110}$ which is significantly smaller than the outside diameter of the planet wheel arrangement. It measures, for example, 127 mm; the outside diameter $\psi_a$ of the planetary system measures approximately 180 mm. The sputtering effect range of the outermost target sections is illustrated by a dash-dotted line. It should be stressed that the workpiece disks, as explained in FIGS. 7 and 8, are moved in a planet-type manner in double rotation parallel along and over the target 110, which results in a homogenizing, which can hardly be surpassed, of all influences on the layer formation on the workpiece disks. The distance d between the new target surface and the workpiece disk surface amounts to less than 30 mm. In addition to being defined by the target 110, the process space P is defined by a screen 112. A ring duct 116 is provided around the screen 112 and is connected by way of openings 114 with the process space. By way of this ring duct 116, the process space is pumped down and a working or reactive gas is charged by way of a gas inlet 118.

Because of the cylindrical shaping clearly visible in FIG. 10 but particularly preferably the spherical shaping of the periphery of the sealing plates 76 and, correspondingly, of the chamber-wall-side sections against which the plate is placed, an extremely low stroke of the sections 62 is sufficient for lifting off the sealing plate for a further rotation according to $\omega_{60}$.

FIG. 10 illustrates a 360°/7-notch of a system with seven stations which can be flanged on and can be operated by the transport arrangement 60, specifically a gate station and six treatment stations. The suggested technique with an optimally homogeneous treatment effect for the workpiece disks, as required particularly for the manufacturing of MO storage disks, results in an extremely compact system if it is considered that the maximum radius of the illustrated six-station system r amounts to only 40 cm.

Despite the target diameter $\psi_{110}$, which is considerably reduced with respect to the outside diameter of the planetary arrangement and thus the outermost area of workpiece disks to be coated, the above-mentioned planetary movement of the workpiece disks plane-parallel to the target 110 permits an optimal homogenizing of the coating. In addition, expensive target material can be saved, specifically by reducing the target surface with respect to the surfaces to be coated.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A vacuum treatment system, comprising a vacuum chamber, at least one planetary transmission system within said vacuum chamber, said at least one planetary transmission system comprising planet wheels conceived as carriers for disk-shaped workpieces and rotatably mounted on a sun wheel of said at least one planetary transmission system; a motor drive outside said chamber operatively coupled to said sun wheel, said planet wheels having an arrangement of magnets coaxially to an axis of said planet wheels, the magnets of said arrangement of said planet wheel being magnetically coupled to a collar of magnets stationarily mounted with respect to said sun wheel and to said planet wheels and coaxially to said axis of said sun wheel.

2. System according to claim 1, wherein said motor drive outside said chamber is magnetically operatively coupled through the chamber wall to said sun wheel.

3. System according to claim 1, wherein said motor drive arranged outside the vacuum chamber acts upon said sun wheel via a vacuum-tight passage through a wall of the vacuum chamber or by a magnetic coupling through the wall.

4. System according to claim 1, wherein said arrangement of magnets and said collar of magnets comprise permanent magnets.

5. System according to claim 1, wherein a plane of the planet wheels is situated perpendicular to a moving direction of a slide arrangement which is linearly controllably movable, the at least one planetary transmission system being arranged at an end side of the slide arrangement.

6. System according to claim 5, comprising at least two slide arrangements and at least two planetary transmission systems provided on a rotationally driven transport arrangement in said chamber, said slide arrangements being linearly controllably movable independently of one another, several openings for flanging-on of workpiece treatment stations being provided in a wall of said chamber, said planet wheels being alignable with and movable toward and away from said opening by said transport arrangement and said slide arrangements.

7. The system of claim 6, further comprising a motor drive fixedly assigned to at least one of said openings, and being operatively coupled to a sun wheel of one of said planetary transmission systems as being aligned with said at least one opening and as the respective slide arrangement being moved toward the respective opening.

8. System according to claim 5, wherein said planet wheels are surrounded by a closing plate which is non-rotatably disposed on said slide arrangement, with a sealing plate closingly entering into an operative connection with the bordering of a respective chamber opening as said slide arrangement is moved towards said opening.

9. The system of claim 5, wherein said collar of magnets is linearly movable with a linearly controllably movable slide arrangement.

10. The system of claim 5, wherein said motor drive is configured to enter into operational connection with said axis of said sun wheel in a predetermined position of said slide arrangement.

11. Vacuum treatment system, comprising a vacuum chamber comprising at least one part rotatably driven and connectable by a gear train with at least two rotating transmission bodies, with a motor drive, whereby the rotating transmission bodies are configured for relative rolling-type motion and have non-aligned rotation axes, and the at least two rotating transmission bodies are magnetically drive-coupled to each other with at least one of the transmission bodies being arranged in the vacuum chamber, having planet wheels operatively connected with said motor drive by a magnetic drive coupling as well as being magnetically coupled with a stationary collar, the planet wheels are carriers for disk-shaped workpieces, and a plane of the planet wheels is situated perpendicular to a moving direction of a slide arrangement which is linearly controllably movable, the planetary transmission being arranged at an end side of the slide arrangement.

12. System according to claim 11, wherein the slide arrangement is at least one slide arrangement provided on a rotationally driven transport arrangement in a chamber, each being linearly controllably movable independently of one another, and several openings for flanging-on of workpiece treatment stations are provided in a wall of the chamber, with which workpiece treatment stations, by way of the transport arrangement and the slide arrangement, the planet wheels are alignable and movable toward and away from them, and a driving arrangement with a magnetic coupling disk is fixedly assigned to at least a portion of the openings, which magnetic coupling disk enters by way of a wall section of the chamber wall at at least one of the at least one slide arrangement into an operative connection with said magnetic coupling disk when, by way of associated ones of said at least one slide arrangement, the planet wheels are moved toward the respective opening, said magnetic coupling disk driving the planetary transmission.

13. System according to claim 11, wherein a sun wheel is operatively connected with said motor drive.

14. System according to claim 13, wherein said magnetic drive coupling is implemented by one of magnetic repulsion or attraction.

15. A process of manufacturing sputter-coated circular disk-shaped workpieces comprising:

(a) depositing disk-shaped workpieces on respective planetary wheels of a planetary transmission system within a vacuum chamber;

(b) providing said planetary wheels adjacent to a common sputtering target;

(c) coupling an axis of a sun wheel of said planetary system to a motor drive being located outside said vacuum chamber;

(d) rotating by said motor drive said sun wheel of said planetary transmission system together with said planetary wheels with said workpieces along a sputtering source;

(e) magnetically coupling a respective arrangement of magnets coaxially provided around respective axes of said planetary wheels with a magnetic collar arrangement being provided stationarily with respect to said sun wheel and to said planetary wheels and coaxially to said axis of said sun wheel so as to rotate said planetary wheels about their axes as said sun wheel is rotated by said motor drive.

16. The process of claim 15, further comprising linearly moving said planetary wheels towards said target into a workpiece treatment position and linearly retracting said planetary wheels from said target after said workpieces have been sputter-coated.

17. The process of claim 16, further comprising linearly moving said sun wheel together with said planetary wheels.

18. The process of claim 17, further comprising coupling said motor drive to said axis of said sun wheel in a predetermined position of said linearly moving.

19. The process of claim 16, further comprising moving said magnetic collar linearly with said planetary wheels.

20. The process of claim 15, further comprising providing at least two planetary transmission systems and a sputtering source, rotatably moving said at least two planetary systems around an axis so as to selectively bring one of said planetary systems into alignment with said sputtering source, linearly moving said planetary wheels of one of said planetary transmission systems towards said sputtering source and rotating said planetary wheels.

21. The process of claim 20, further comprising separating said chamber from said sputtering source mounted thereto as said planetary wheels are moved towards said sputtering source.

* * * * *